US010330699B2

(12) United States Patent
Olivier et al.

(10) Patent No.: US 10,330,699 B2
(45) Date of Patent: Jun. 25, 2019

(54) DEVICE COMPRISING ELEMENTS FOR MEASURING CURRENT AND PROCESS FOR MANUFACTURING SUCH A DEVICE

(71) Applicant: Schneider Electric Industries SAS, Rueil Malmaison (FR)

(72) Inventors: Audrey Olivier, Teche (FR); David Loglisci, Uriage (FR); Michel Rapeaux, La Morte (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 370 days.

(21) Appl. No.: 14/972,282

(22) Filed: Dec. 17, 2015

(65) Prior Publication Data

US 2016/0178661 A1    Jun. 23, 2016

(30) Foreign Application Priority Data

Dec. 23, 2014    (FR) ..................... 14 63219

(51) Int. Cl.
*G01R 1/04* (2006.01)
*B23K 26/21* (2014.01)
(Continued)

(52) U.S. Cl.
CPC ............ *G01R 1/04* (2013.01); *B23K 26/21* (2015.10); *G01R 15/181* (2013.01); *H01F 27/02* (2013.01); *H01F 38/30* (2013.01); *B29C 65/1612* (2013.01); *B29C 65/1616* (2013.01); *B29C 65/1635* (2013.01); *B29C 66/53461* (2013.01);
(Continued)

(58) Field of Classification Search
None
See application file for complete search history.

(56) References Cited

U.S. PATENT DOCUMENTS

2004/0112519 A1* 6/2004 Mori .................. B29C 65/1635
                                                                156/272.8
2005/0082265 A1* 4/2005 Yamabuki .......... B29C 65/1635
                                                                219/121.64
(Continued)

FOREIGN PATENT DOCUMENTS

EP    2 667 205 A1    11/2013
JP    57-184398       11/1982

OTHER PUBLICATIONS

French Preliminary Search Report dated Nov. 3, 2015 in French Application 14 63219, filed Dec. 23, 2014 (with English Translation of Categories of Cited Documents).

*Primary Examiner* — Stanley Tso
(74) *Attorney, Agent, or Firm* — Oblon, McClelland, Maier & Neustadt, L.L.P.

(57) ABSTRACT

A device comprises elements for measuring current, the elements being housed in a casing. The casing includes a first portion and a second portion made of plastic, welded to each other, which together define a housing for receiving the measuring elements. The first portion is opaque in order to absorb a laser beam for welding the portions, and the second portion is transparent in order to let the laser beam pass. The process for manufacturing the device includes a fitting step in which the measuring elements are fitted into the casing and an assembly step in which the portions of the casing are joined together using a laser welding process.

13 Claims, 3 Drawing Sheets

(51) Int. Cl.
    *G01R 15/18*     (2006.01)
    *H01F 38/30*     (2006.01)
    *H01F 27/02*     (2006.01)
    *B29L 31/34*     (2006.01)
    *B29C 65/16*     (2006.01)
    *B29C 65/00*     (2006.01)

(52) U.S. Cl.
    CPC .......... *B29C 66/542* (2013.01); *B29C 66/543* (2013.01); *B29C 66/7392* (2013.01); *B29C 66/919* (2013.01); *B29L 2031/3481* (2013.01)

(56) References Cited

U.S. PATENT DOCUMENTS

| | | | |
|---|---|---|---|
| 2006/0178038 A1* | 8/2006 | Eakins | H01R 13/422 439/475 |
| 2009/0039880 A1 | 2/2009 | Nomura et al. | |
| 2012/0140391 A1 | 6/2012 | Nickel et al. | |
| 2013/0314083 A1* | 11/2013 | Loglisci | G01R 3/00 324/244 |
| 2015/0083484 A1* | 3/2015 | Pinol Pedret | H01M 10/48 174/520 |
| 2015/0136318 A1* | 5/2015 | Tiefel | B32B 38/0008 156/272.8 |
| 2016/0152798 A1* | 6/2016 | Kamimoto | C08K 3/26 524/100 |
| 2016/0207041 A1* | 7/2016 | Weber | B01L 3/502707 |
| 2016/0304252 A1* | 10/2016 | Shinozaki | B65D 77/20 |

\* cited by examiner

DEVICE COMPRISING ELEMENTS FOR MEASURING CURRENT AND PROCESS FOR MANUFACTURING SUCH A DEVICE

The invention pertains to a device comprising current measuring elements and to a process for manufacturing such a device.

The invention relates in particular to mixed current sensors comprising in a casing a magnetic current sensor having a coil wound around a magnetic circuit and a current measuring device comprising a coil of Rogowski type.

Current measuring devices of Rogowski type, such as the current sensor of document EP-A-2 667 205, comprise a support made of amagnetic material placed around a current conductor or line in which the current to be measured flows. A conducting wire is coiled on the support to form a secondary winding. The unit forms a transformer where the current conductor or line constitutes a primary winding and the secondary winding provides a measurement signal. The voltage provided across the terminals of the secondary winding is directly proportional to the intensity of the electric current flowing in the current conductor or line. The absence of magnetic core running the risk of being saturated allows a wide dynamic range of measurement.

The casing of the current sensor is made in two portions, with a hollow plinth closed off by a cover assembled to the plinth for example by welding. The insulation of the current sensor is simply ensured by the electronics of the sensor. The dielectric insulation is situated between the current lines and the casing of the sensor. Should there be a defect at the level of the welding of the portions of the casing, the user is in danger.

To allow in particular the addition of a socket, for example of standard USB type, it is necessary to improve the insulation achieved by the casing of the current sensor since the USB socket generates current leakages. For example, the current sensor is integrated into an isolator exhibiting a front face equipped with a programmable interface endowed with a USB socket. The current sensor is linked to the front face not of the electrical wires. It is necessary to insulate the user from the voltage present in the isolator and through the sensor.

The invention envisages proposing a current sensor having improved dielectric insulation at a high operating temperature, above 140° C.

For this purpose, the subject of the invention is a device comprising current measuring elements housed in a casing, the casing comprising a first portion and a second portion made of plastic, welded to each other, which together delimit a housing for receiving the measuring elements. The first portion is opaque so as to absorb a laser beam for welding the portions of the casing. The second portion is transparent so as to allow the laser beam to pass through.

By virtue of the invention, the materials employed for the casing of the device permit laser welding of the first portion of the casing on the second portion, thereby improving the electrical insulation achieved by the casing. It is thus unnecessary to make provision that the electronics inside the casing ensure a dual-insulation function, which is expensive, complex, and results in increased bulk.

According to advantageous aspects of the invention, such a device can incorporate one or more of the following characteristics, taken in any technically admissible combination:

The first portion absorbs at least 60%, preferably at least 90%, of the power of a laser beam having a wavelength lying between 625 and 1100 nm, the material of the first portion being in particular of black colour.

The second portion allows through at least 30% of the power of a laser beam having a wavelength lying between 625 and 1100 nm.

The first portion delimits the housing and the second portion is plane.

Preferably, the thickness of the second portion lies between 0.5 and 3 mm, preferably lying between 0.8 and 1.6 mm.

The portions of the casing are manufactured from a polymeric composition with an organophosphorus flame retardant.

The edges of at least one of the portions of the casing are provided with tabs, preferably sectile.

Another aspect of the invention relates to a process for manufacturing a device comprising current measuring elements housed in a casing comprising a first portion and a second portion which together delimit a housing for receiving the measuring elements, the process comprising a fitting step in which the measuring elements are fitted into the casing. The process comprises an assembly step in which the portions of the casing are assembled together by a laser welding process.

According to advantageous aspects of the invention, such a process can incorporate one or more of the following characteristics, taken in any technically admissible combination:

The process comprises an intermediate step between the fitting step and the assembly step, in which the housing is depressurized, for example a depressurization greater than 60 kPa, preferably greater than 90 kPa.

Preferably, the edges of at least one of the portions of the casing are provided with pressing tabs. During the intermediate step, a pressing on the tabs reinforces the mechanical contact between the portions of the casing.

The invention will be better understood on reading the following description, given solely by way of example, of a device in accordance with the invention, and of its manufacturing process, with reference to the appended drawings in which.

Figure 1:
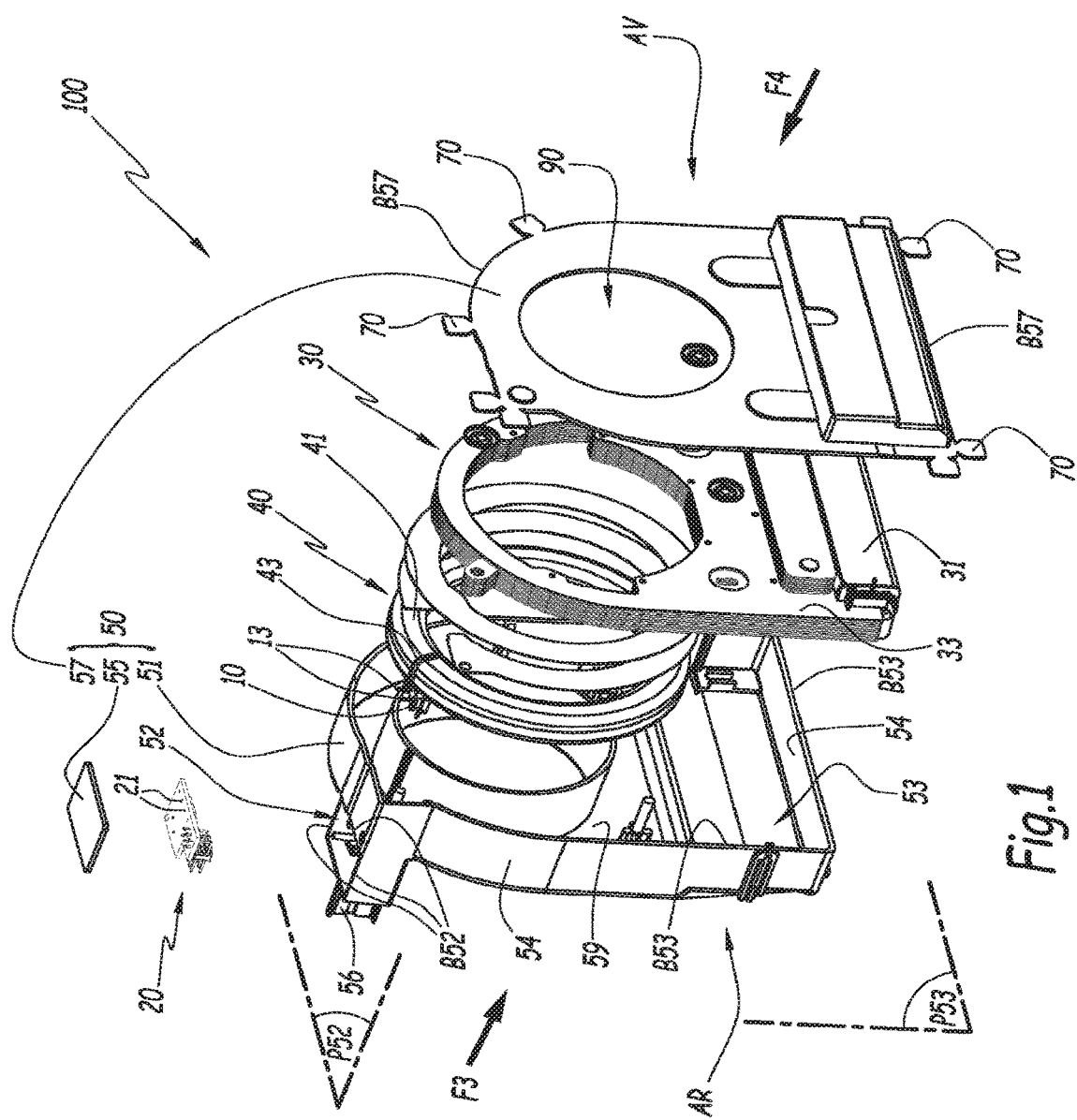
FIG. 1 is an exploded perspective view of a current sensor in accordance with the invention.
Figure 2:
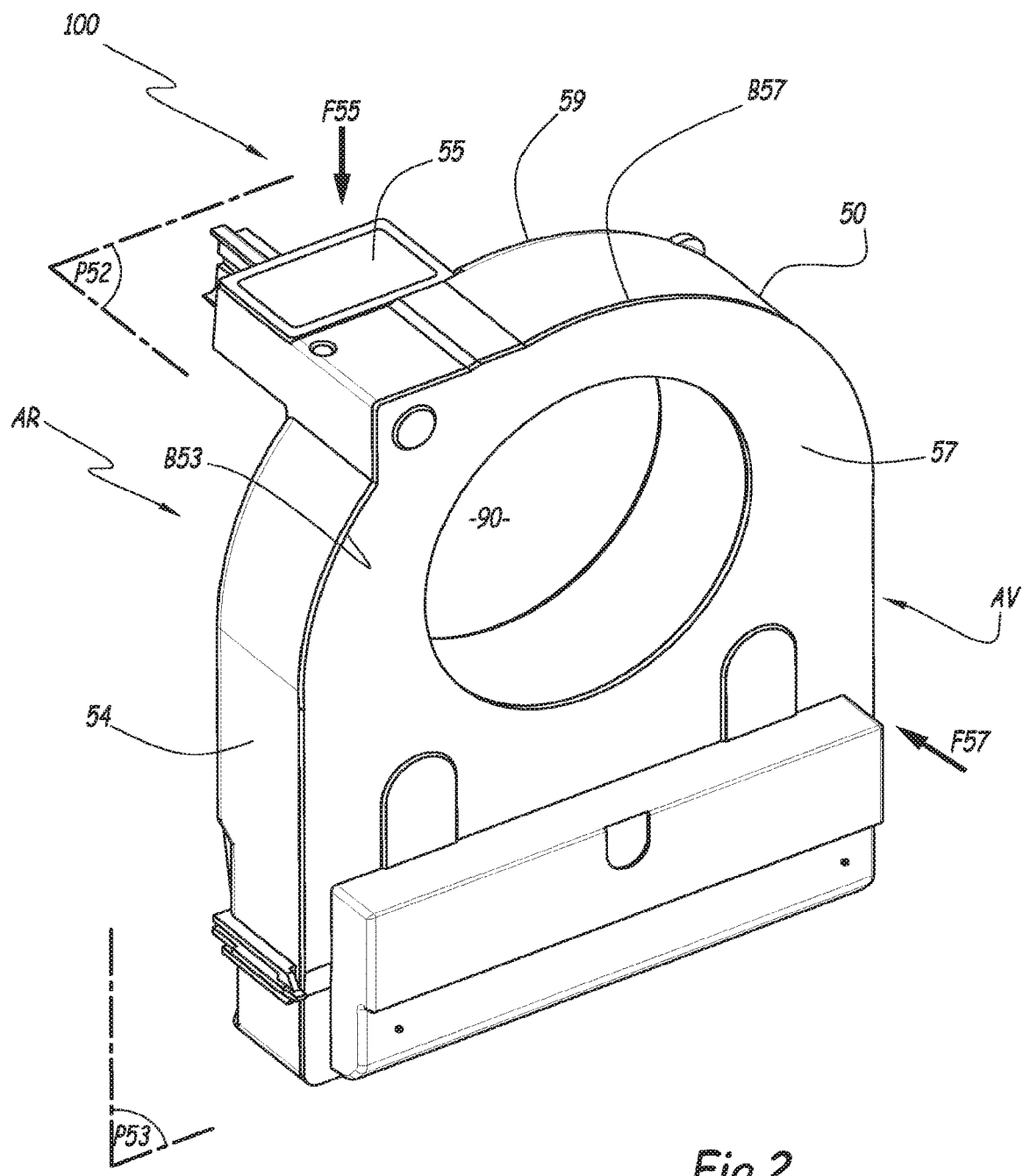
FIG. 2 is a perspective view of the current sensor in the assembled configuration.
Figure 4:
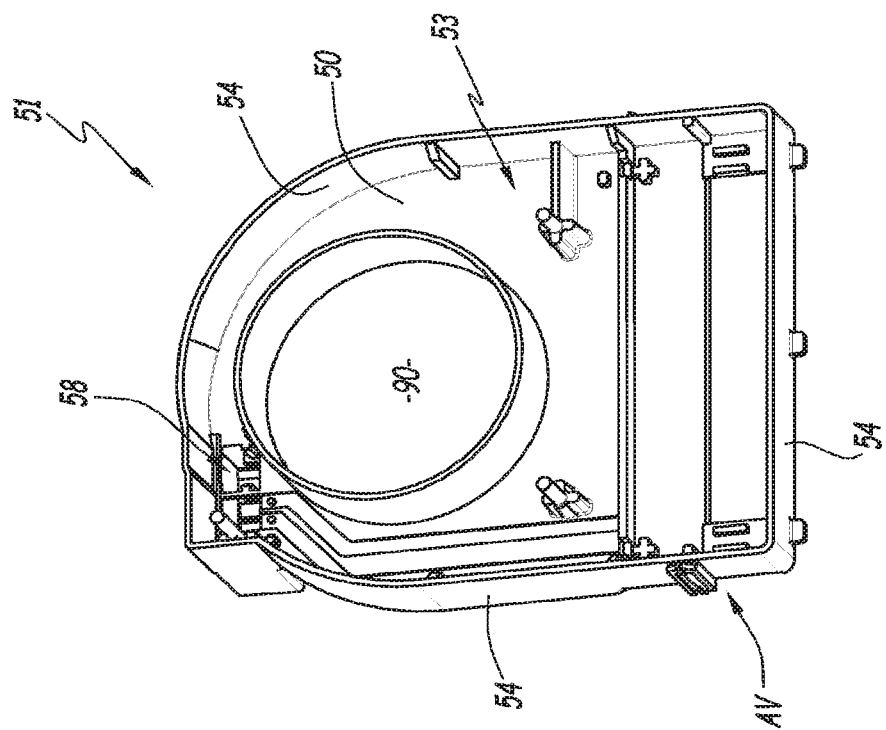
FIGS. 3 and 4 are perspective views of a plinth of a casing of the current sensor of FIGS. 1 and 2, according to the arrows F3 and F4 in FIG. 1.

The current sensor 100 represented in FIGS. 1 and 2 comprises a magnetic sensor of electric current 30 and an electric current measuring device 40 which are assembled in a casing 50. This is a mixed current sensor.

The magnetic sensor 30 comprises a first coil 31 wound around a magnetic circuit 33.

The measuring device 40 comprises a second coil 41 of Rogowski type disposed in such a way that a first primary circuit of the magnetic sensor 30 corresponds to a second primary circuit of the current measuring device 40. The coil 41 of Rogowski type is composed of an insulating carcass 43 on which a metallic wire is coiled. By way of exemplary embodiment, the carcass 43 is of hollow, circular shape, made of amagnetic material, rigid or semi-rigid and preferably of cylindrical or ovoid cross section. The metallic wire wound on the carcass 43 is preferably made of copper or a copper-based alloy.

The casing 50 is furnished with a central recess 90 allowing the passage of the current conductor or line on which the measurement of the current is performed. This current conductor or line forms the primary circuit of the current measuring device 40.

The current sensor 100 comprises electronic means 20 of acquisition and measurement of the electric current. The electronic means 20 are supplied through the coil 31 of the magnetic sensor 30.

A linking cassette 10 comprising fixing means links the measuring device 40 to the electronic means 20.

The casing 50 comprises a first portion or plinth 51, comprising a housing 52 for the electronic means of acquisition and measurement 20. One of the walls 56 of the housing 52 comprises an opening 58 for the passage of the linking cassette 10.

The fixing means are designed to position and hold by snap-fastening the cassette 10 on the current measuring device 40. The cassette 10 is fixed on the measuring device 40 in a reproducible position, thereby making it easier to fit the current sensor 100.

The carcass 43 of the coil 41 comprises snap-fastening means able to collaborate with the fixing means of the linking cassette 10.

Second fixing means of the cassette 10 are designed to position and hold by snap-fastening the cassette 10 and the measuring device 40 on the casing 50. The unit formed by the linking cassette 10 and the measuring device 40 is fixed to the casing 50 in a reproducible position, thereby making it easier to fit the current sensor 100.

The cassette 10 comprises electrical pins 13 linked respectively to the coil 41 and to the electronic means 20. By way of example, the electrical pins 13 are welded to the electronic means 20. An automated welding process by laser tin soldering can be used. Optionally, the electronic means 20 comprise connection pads intended to be linked to a socket.

The plinth 51 delimits a first hollow housing 53 inside which are positioned the magnetic sensor 30 and the measuring device 40. The plinth 51 comprises a globally plane back wall 59 which defines a rear face AR of the current sensor 100 and communicates with the second housing 52 through the opening 58. The back wall 59 is adjoining lateral walls 54 of the plinth extending perpendicularly to the back wall 59. External edges B53 of these walls 54 extend in a first plane P53. The housing 53 is a hollow volume open towards the exterior of the casing 50, away from the back wall 59.

The back wall 59 has globally the shape of a rectangle, an edge of small length of which is semicircle-shaped.

The casing 50 comprises a second portion or first plane cover 57 fixed on the external edges B53 of the walls 54 of the housing 53 of the plinth 51, which closes off the housing 53 and defines the front face AV of the casing 50. The cover 57 is parallel to the back wall 59 and its shape is analogous to that of the back wall 59. The external edges of the cover 57, which are welded to the edges B53 of the walls 54, are denoted B57.

The magnetic sensor 30 is connected to the electronic means 20 by electrical tracks. The electronic means 20 comprise a printed circuit board designed to be positioned inside the walls 56 of the second housing 52. The board of the printed circuit comprises holes 21 permitting the passage by interlocking of the electrical pins 13 of the cassette 10.

In an optional manner, the casing 50 comprises a second plane cover 55 intended to be fixed on external edges B52 of the walls 56 of the second housing 52 of the plinth 51. The edges B52 extend in a second plane P52 perpendicular to the first plane B53. The edges B52 delimit an opening of the housing 52 which emerges outside the casing 50.

The plinth 51 and the covers 55 and 57 together delimit the hollow volume of the casing 50, that is to say the housing 53.

The plinth 51 and the covers 55 and 57 are manufactured from a plastic material, for example a polymer, adapted for allowing assembly of the covers 55 and 57 with the plinth 51 by a laser welding process. The wavelength of the laser beam used for this assembly, represented by the arrows F55 and F57 in FIG. 2, lies in the region of the infrared, namely between 625 and 1100 nm. By way of example, the wavelength of the laser beam F55 or F57 is equal to 980 nm. For example, the power of the laser beam F55 or F57 is equal to 480 W.

For the welding of the first cover 57, the laser beam F57 is oriented perpendicularly to the plane of the cover 57 and to the edges B53, parallel to the walls 54 of the plinth 51. The laser beam F57 is positioned outside the casing 50, in the prolongation of the walls 54 of the housing 53 and it is oriented in the direction of the cover 57.

For the welding of the second cover 55, the laser beam F55 is oriented perpendicularly to the plane of the cover 55, parallel to the walls 56 and to the edges B52, and in their prolongation. The laser beam F55 is positioned outside the casing 50, in the prolongation of the walls 56 of the housing 52 and it is oriented in the direction of the cover 55.

The laser beam F55 or F57 melts the material of the casing 50, thereby welding the cover 55 or 57 to the edges B52 or B53 of the plinth 51. Thus, continuity of material is obtained between the plinth 51 and the cover 55 or 57 and the free spaces between these elements are removed, thereby improving the electrical insulation of the casing 50. Dielectric leaktightness between the plinth 51 and the cover 55 or 57 is thus achieved.

The material of the covers 55 and 57 is chosen so that, during welding, the laser beam F55 or F57 passes through the material of the cover 55 or 57 and that it is absorbed by the material of the casing 51. The covers 55 and 57 are transparent so as to allow the beam F55 or F57 to pass through, at least partially, while the plinth 51 is opaque so as to absorb the beam F55 or F57, at least partially.

The covers 55 and 57 allow the laser beam F55 or F57 to pass through in a more significant manner than the plinth 51. Likewise, the plinth 51 absorbs the laser beam F55 or F57 in a more significant manner than the covers 55 and 57.

The term "transparent" is understood to mean that the covers 55 and 57 allow through at least 60% of the total intensity of the beam F55 or F57, preferably at least 90%. The value of the transparency of the covers 55 and 57 depends on their respective thickness. Preferably, the thickness of the covers 55 and 57 lies between 0.5 and 3 mm, preferably between 0.8 and 1.6 mm. For example, the covers 55 and 57 have a constant thickness of 1.2 mm.

The term "opaque" is understood to mean that the plinth absorbs at least 30% of the total intensity of the beam F55 or F57.

For example, the covers 55 and 57 and the plinth 51 are manufactured from a fireproofed plastic, made from a polymeric composition with a flame retardant. For example, the polymeric composition is a resin of partially aromatic polyamide type reinforced with glass fibres to a level of 20 to 40% and fireproofed, preferably with an organophosphorus fireproofing system. The "natural" colour shade will preferably be chosen for the covers 55 and 57. Other light colours may be appropriate. And the "black" colour shade will preferably be chosen for the plinth 51, but other absorbent colours may be appropriate. The colour black is obtained for example by the addition of black pigments which favour the absorption of the laser beam F1 or F2. This may be a mineral pigment of carbon black type, or an organic pigment of negrosin type.

These materials comply with the standard CEI 60947-1 relating to electrical insulation. As indicated in table XV of this standard, for an assigned insulation voltage Ui of 1000 V, the minimum length of the leakage lines Lf, for a degree of pollution 3 and group I materials, is equal to 12.5 mm. For an assigned insulation voltage Ui of 1250 V, the minimum length of the leakage lines Lf is equal to 16 mm. For a reinforced insulation, these lengths are doubled. The groups of materials are defined by their comparative tracking index, which is greater than or equal to 600 V for group I.

The degree of pollution is defined by standard CEI 60664-1:1992 and characterizes the envisaged pollution of the micro-environment. The degree of pollution 3 indicates the presence of conducting pollution or of dry, non-conducting pollution, which becomes conducting subsequent to the condensation which may occur.

In accordance with standard CEI 61140, in paragraph 5.1, paints, varnishes, lacquers and analogous products are not considered to constitute sufficient insulation for protection against electric shocks during normal operation.

As a variant, the plinth 51 and the first cover 57 of the casing 50 are replaced with two half-casings which each have a hollowed shape and which each comprise external edges extending in a plane and intended to be fixed together. These two portions of the casing then define a volume for receiving the magnetic sensor and the measuring device 40, when they are in the assembled configuration, that is to say when their external edges are fixed together.

The invention has been described with reference to a mixed current sensor including Rogowski type coil, but it also applies to other types of current sensors. In the example described, the elements 10, 20, 30 and 40 form means for measuring the current, but these elements can be replaced with other types of current measuring means.

As a variant, the invention applies to any system which comprises current measuring elements, for example a sensor, an inductor, Hall-effect sensors or magnetoresistance-type sensors, or indeed electromechanical elements, for example an actuator such as a control member, in particular an isolator.

The invention also relates to a process for manufacturing a system comprising electronic or electromagnetic current measuring elements. This may be a current sensor such as the current sensor 100 described hereinabove.

The process consists, in a first step, in fitting the cassette 10, the electronic means 20, the magnetic sensor 30 and the measuring device 40 into the housing 53 of the plinth 51 of the casing 50.

The cassette 10 is fixed on the carcass 43 of the measuring device 40. The wires of the Rogowski type coil 41 are linked electrically to the electrical pins 13 of the cassette 10.

The unit formed by the cassette 10 and the carcass 43 is then positioned and fixed in the housing 53 of the plinth 51 of the casing 50.

The magnetic sensor 30 is thereafter fixed in the plinth 51 of the casing 50. Fixing means make it possible to fasten the magnetic sensor 30 and the measuring device 40 to the plinth 51 of the casing 50. An electrical link is made between the electrical tracks and the coil 31 of the magnetic sensor 30. The link may be ensured for example by electrical welding.

The printed circuit board of the electronic means 20 is thereafter positioned inside the walls of the first housing 52.

The electrical pins 13 of the linking cassette 10 pass through the holes 21 present on the circuit. The electrical pins 13 are then welded preferably by an automated welding process by laser tin soldering.

In a subsequent step, the covers 55 and 57 are assembled to the plinth 51. The order of assembly of the covers 55 and 57 on the plinth is immaterial.

The first cover 57 is positioned on the external edges B53 of the walls 54 of the first housing 53 of the plinth 51. The first cover 57 and the edges B53 extend in the plane P53, ensuring mechanical contact between the edges B53 and the cover 57. The first cover 57 is then welded on the edges B53 by means of the laser beam F57.

To improve the mechanical contact during the laser welding between the plinth 51 and the first cover 57, a suction system is used to pull a vacuum inside the casing 50, before the welding of the cover 55. For example, the vacuum is created through the opening 58 of the plinth 51. A vacuum switch verifies the pressure inside the casing 50. During the passage of the laser beam F57, a decrease of 0.3 mm in the thickness of the cover 57 is noted. The depressurization makes it possible to ensure mechanical contact between the cover 57 and the plinth 51 despite this deformation. For example, the depressurization is greater than 60 kPa, preferably greater than 80 kPa.

In order to improve the mechanical contact between the cover 57 and the casing 51, the cover 57 is provided with tabs 70 distributed along the edges B57 of the cover 57. During the welding of the cover 57, when the casing 50 is depressurized, fingers of a robot, which is not represented, press on these tabs 70 so as to favour the contact with the plinth 51. Preferably, the tabs 70 are sectile so that they can be easily torn off later.

The second cover 55 is positioned on the external edges B52 of the walls 56 of the second housing 52. The external edges B52 and the second cover 55 extend in the plane P52, thereby ensuring mechanical contact between the edges B52 and the cover 55. The second cover 55 is then welded on the edges B52 by means of the laser beam F55.

Figure 3:
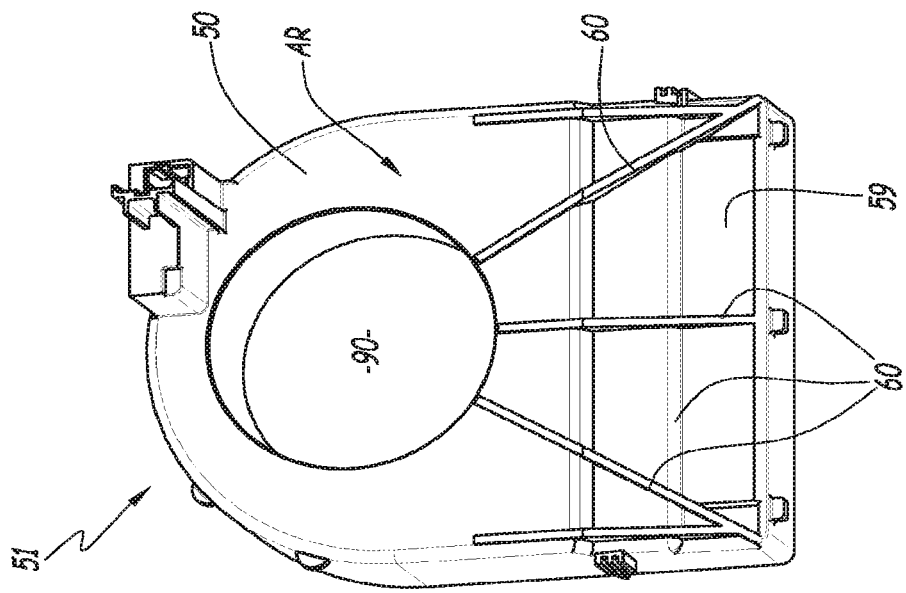

As visible in FIG. 3, the back wall 59 of the plinth 51 is provided with strengthening ribs 60, on its exterior face, which participate in the geometric conformity of the plinth 51 during the moulding of this part.

In the example described, the plinth 51 delimits the housing 53 and the cover 57 is plane. As a variant, the two portions 51 and 57 of the casing 50 may each delimit a housing, that is to say exhibit a concave shape. The hollow volume of the casing 50 is then formed by the joining of these two housings.

The presence of several covers 55 and 57 is optional; the casing 50 may comprise a single cover.

In accordance with the invention, the different variants described may be combined together, at least partially.

The invention claimed is:
1. A device comprising:
a magnetic current sensing assembly;
a current measuring assembly; and
a casing that houses the magnetic current sensing assembly and the current measuring assembly,
wherein the casing includes a first portion and a second portion made of plastic, laser welded to each other, which together delimit a housing that receives the magnetic current sensing assembly and the current measuring assembly,
wherein the first portion is opaque so as to absorb a laser beam for welding together the first and second portions, and in that the second portion is transparent so as to allow the laser beam to pass through,
wherein the casing defines a central recess circumscribed by the magnetic current sensing assembly and the current measuring assembly, and
wherein a rear face of the first portion includes a plurality of strengthening ribs, each of the strengthening ribs extending radially outward from the central recess to respective edge portions of the rear face.

2. The device according to claim 1,
wherein the first portion absorbs at least 60% of the power of the laser beam, which has a wavelength between 625 and 1100 nm, and
wherein a material of the first portion is black in color.

3. The device according to claim 1, wherein the second portion allows through at least 30% of the power of the laser beam, which has a wavelength between 625 and 1100 nm.

4. The device according to claim 1, wherein the second portion is planar.

5. The device according to claim 4, wherein a thickness of the second portion is between 0.5 and 3 mm.

6. The device according to claim 1, wherein the first and second portions of the casing are manufactured from a polymeric composition with an organophosphorus flame retardant.

7. The device according to claim 1, wherein edges of at least one of the first and second portions of the casing are provided with tabs.

8. The device according to claim 7, wherein the tabs are sectile tabs.

9. The device according to claim 1, wherein all external edges of the first portion that face the second portion are in a same plane for welding together with the second portion.

10. The device according to claim 1, wherein the first portion and the second portion are not laser welded together at the perimeter of the central recess.

11. The device according to claim 1, wherein the second portion of the casing is comprised of two distinct covers, a first planar cover and a second planar cover, being welded to the first portion at different and non-touching parts of the first portion.

12. The device according to claim 11, wherein the first planar cover is in a first plane and the second planar cover is in a second plane different from and perpendicular to the first plane.

13. The device according to claim 11, wherein the second planar cover is globally planar.

* * * * *